United States Patent
Yamamoto

(10) Patent No.: US 6,329,300 B1
(45) Date of Patent: Dec. 11, 2001

(54) METHOD FOR MANUFACTURING CONDUCTIVE PATTERN LAYER BY TWO-STEP WET ETCHING PROCESS

(75) Inventor: Atsushi Yamamoto, Akita (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/626,654

(22) Filed: Jul. 27, 2000

(30) Foreign Application Priority Data

Jul. 29, 1999 (JP) .................................................. 11-215893

(51) Int. Cl.⁷ ........................ H01L 21/302; H01L 21/461
(52) U.S. Cl. ........................ 438/745; 438/689; 438/701; 438/713; 438/734; 257/383; 216/13; 216/17; 216/83
(58) Field of Search ..................................... 438/149, 689, 438/701, 713, 734, 745; 216/13, 17, 83; 257/59, 383, 72

(56) References Cited

FOREIGN PATENT DOCUMENTS

| | | |
|---|---|---|
| 61-4233 | 1/1986 | (JP) . |
| 3-266426 | 11/1991 | (JP) . |
| 7-64112 | 3/1995 | (JP) . |
| 9-33949 | 2/1997 | (JP) . |
| 10-10585 | 1/1998 | (JP) . |
| 10-81981 | 3/1998 | (JP) . |
| 10-107015 | 4/1998 | (JP) . |
| 10107015-A * | 4/1998 | (JP) .............................. H01L/21/308 |

* cited by examiner

Primary Examiner—Charles Bowers
Assistant Examiner—Hsien-Ming Lee
(74) Attorney, Agent, or Firm—Michael Best & Friedrich LLC; J. Warren Whitesel

(57) ABSTRACT

In a method for manufacturing a conductive pattern layer, a conductive layer is deposited on a substrate, and an etching mask layer is coated onto the conductive layer. First, the conductive layer is etched by a first etching solution using the etching mask layer to expose the substrate a sidewall of the conductive layer. Then, the conductive layer is etched by a second etching solution using the etching mask to retard the sidewall of the conductive layer.

17 Claims, 8 Drawing Sheets

METHOD FOR MANUFACTURING CONDUCTIVE PATTERN LAYER BY TWO-STEP WET ETCHING PROCESS

BACKGROUND OF THE INVENTION

1. Field of the Invention

The present invention relates to a method for manufacturing a conductive pattern layer, and more particularly, to a method for manufacturing: a molybdenum (Mo) layer which is used in a thin film transistor (TFT) of a liquid crystal display (LCD) apparatus.

2. Description of the Related Art

In a method for manufacturing an LCD apparatus, a refractory metal layer is used for gate electrodes, source electrodes and drain electrodes of TFTs in order to reduce the resistance thereof.

Generally, etching of refractory metal requires a large scale dry processing apparatus by gas plasma, which increases the manufacturing cost. However, Mo has an advantage that etching of Mo can be carried out by a wet processing apparatus, thus decreasing the manufacturing cost. Note that Mo is also resistant to alkali, which is another advantage.

In a prior art method for manufacturing a Mo pattern layer, a Mo layer is deposited on a substrate, and a photoresist pattern layer is coated on the Mo layer. Then, the No layer is etched by a nitric acid/phosphoric acid/acetic acid solution using a photoresist pattern layer to expose the substrate. This will be explained later in detail.

In the above-described prior art method, however, since the Mo layer has a columnar structure perpendicular to the glass substrate, overhanging edges are formed on the ends of the Mo layer. Also, since the etching solution has a high viscosity, the etching solution cannot penetrate the interface between the Mo layer and the photoresist pattern, so as to enhance the overhanging edges. Also, the coverage characteristics of an insulating layer on the Mo layer deteriorate, due to the overhanging edges of the Mo layer, so that voids would be generated in the insulating layer in the proximity of the overhanging edges. As a result, the breakdown voltage characteristics of the insulating layer between the Mo layer and an upper conductive layer deteriorate due to the presence of the voids. Also, electrostatic destruction would start from the overhanging edges of the Mo layer, which would destroy elements connected to the Mo layer. Further, since the coverage characteristics of the upper conductive layer deteriorate, short-circuited states are generated in the upper conductive layer.

SUMMARY OF THE INVENTION

It is an object of the present invention to provide a method for manufacturing a conductive pattern layer such as a Mo pattern layer capable of suppressing the generation of overhanging edges.

According to the present invention, in a method for manufacturing a conductive pattern layer, a conductive layer is deposited on a substrate, and an etching mask layer is coated on the conductive layer. First, the conductive layer is etched by a first etching solution using an etching mask layer to expose the substrate a sidewall of the conductive layer. Then, the conductive layer is etched by a second etching solution using the etching mask to retard the sidewall of the conductive layer.

Thus, even if overhanging edges are generated in the conductive layer by the first etching step, such overhanging edges are removed by the second etching step.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, a prior art method for manufacturing a conductive pattern layer will be explained with reference to FIGS. 1A, 1B, 1C, 1D, 1E and 2.

Figure 1A:
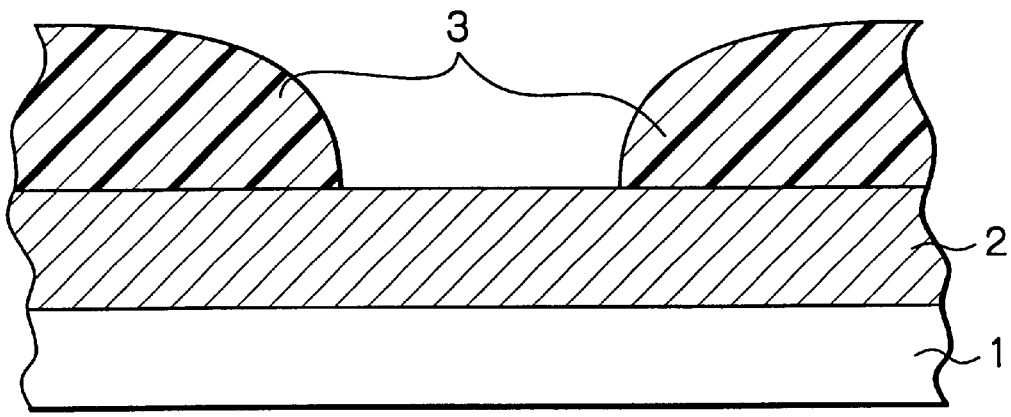
FIGS. 1A through 1E are cross-sectional views for explaining a prior art method for manufacturing a conductive pattern layer.

First, referring to FIG. 1A, a Mo layer 2 is deposited on a glass substrate 1 by a sputtering process. Then, a photoresist pattern layer 3 is coated on the Mo layer 2.

Figure 1B:
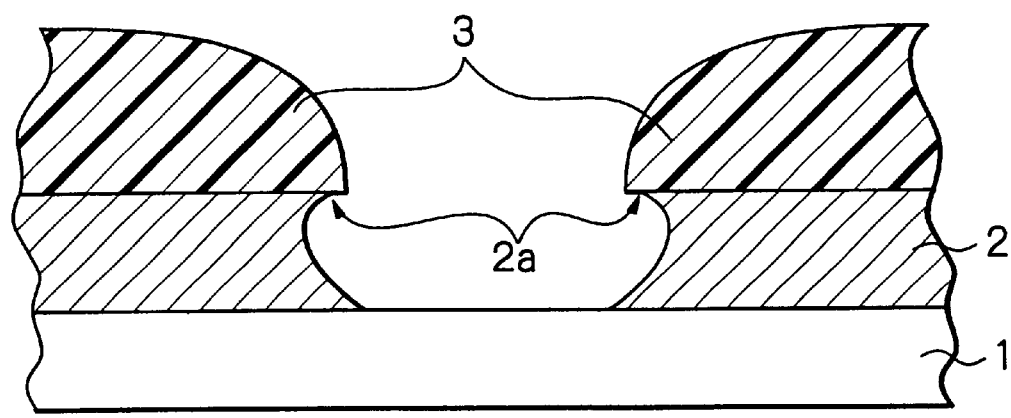
Figure 2:
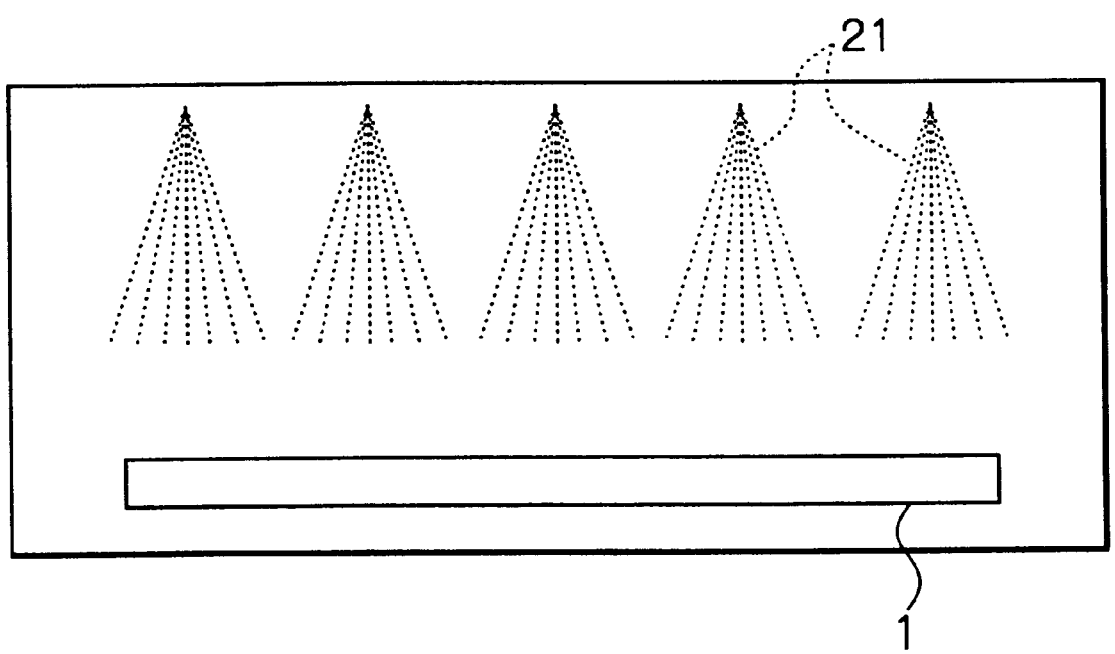
FIG. 2 is a diagram illustrating a spray-type leaf-type wet processing apparatus used for etching the Mo layer of FIG. 1B.

Next, referring to FIG. 1B, the a Mo layer 2 is etched by a wet process using a nitric acid/phosphoric acid/acetic acid solution having a high viscosity under a spray-type leafform type wet processing apparatus as illustrated in FIG. 2. Note that the wet processing apparatus of FIG. 2 has a plurality of nozzles for spraying solution onto the substrate 1.

As illustrated in FIG. 1B since the Mo layer 2 has a columnar structure perpendicular to the glass substrate 1, overhanging edges 2a are formed on the ends of the Mo layer 2. Also, since the etching solution has a high viscosity, the etching solution cannot penetrate the interface between the Mo layer 2 and the photoresist pattern 3, so as to enhance the overhanging edges 2a.

Figure 1C:
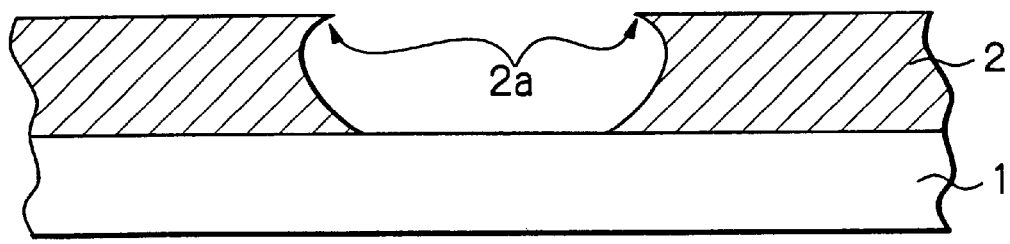

Next, referring to FIG. 1C, the photoresist pattern 3 is removed.

Note that the Mo layer 2 serves as a lower conductive layer.

Figure 1D:
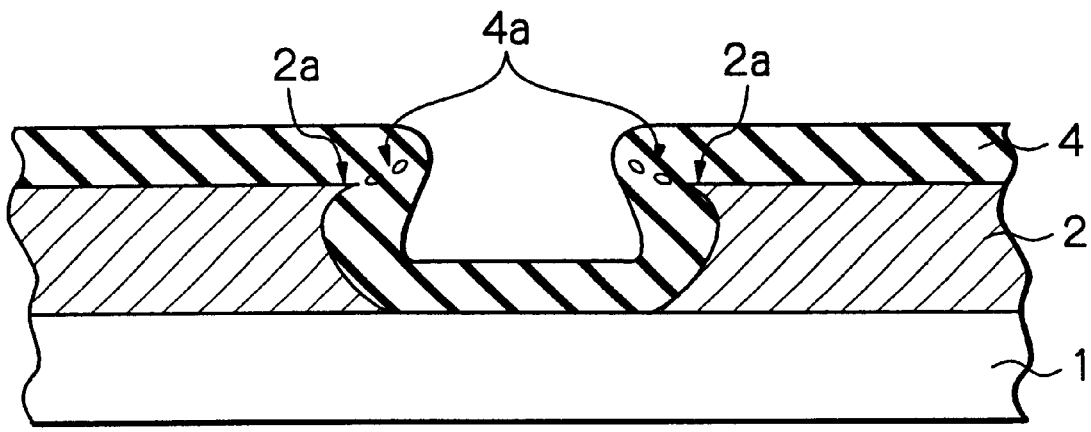

Next, referring to FIG. 1D, an insulating layer 4 made of silicon nitride or the like is formed on the Mo layer 2 by a chemical vapor deposition (CVD) process. In this case, the coverage characteristics of the insulating layer 4 deteriorate, due to the overhanging edges 2a of the Mo layer 2, so that voids 4a would be generated in the insulating layer 4 in the proximity of the overhanging edges 2a of the Mo layer 2.

Figure 1E:
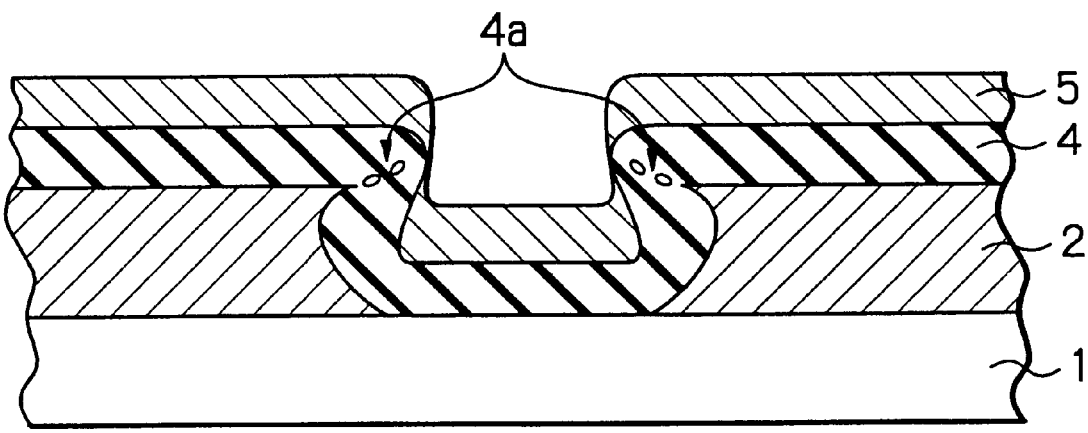

Finally, referring to FIG. 1E, an upper conductive layer 5 made of Mo, Cr, indium tin oxide (ITO) or the like is formed on the insulating layer 4.

In the above-described prior art method, however, the breakdown voltage characteristics of the insulating layer 4 between the conductive layers 2 and 5 deteriorate due to the presence of the voids 2a. Also, electrostatic destruction would start from the overhanging edges 2a of the Mo layer 2, which would destroy elements connected to the Mo layer 2. Further, since the coverage characteristics of the upper conductive layer 5 deteriorate, short-circuited states are generated in the upper conductive layer 5.

An embodiment of the method for manufacturing a conductive pattern layer according to the present invention will be explained next with reference to FIGS. 3A, 3B, 3C, 3D, 3E, 3F, 4, 5A, 5B and 5C.

Figure 3A:
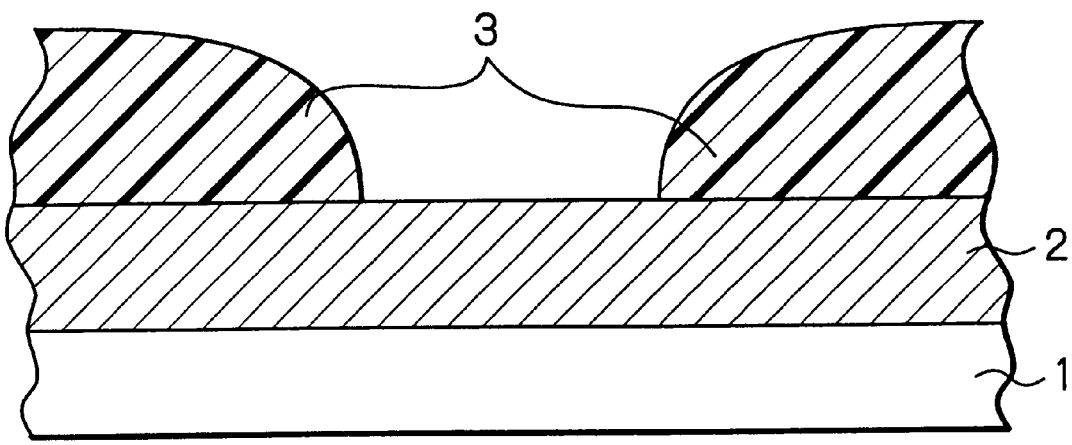
FIGS. 3A through 3F are cross-sectional views for explaining an embodiment of the method for manufacturing a conductive pattern layer according to the present invention.

First, referring to FIG. 3A, in the same way as in FIG. 1A, an about 330 nm thick Mo layer 2 is deposited on a glass substrate 1 by a sputtering process using argon gas having a flow rate of about 45 sccm and a pressure of about 0.15 Pa at a substrate temperature of about 200° C. for about 50 sec. Then, after the substrate 1 is irradiated with ultraviolet rays, the substrate 1 is cleaned by an alkali solution and is rinsed by pure water. Next, a photoresist layer is coated on the Mo layer 2 by a spin coater, and is prebated at a temperature of about 120° C. for about 200 sec. Then, the photoresist layer is exposed with ultraviolet rays by a stepper, and is developed to form a photoresist pattern layer 3 on the Mo layer 2. Note that a post-bake is not performed upon the developed photoresist layer 3, in order to penetrate etching solution into an interface between the photoresist pattern layer 3 and the Mo layer 2.

Figure 3B:
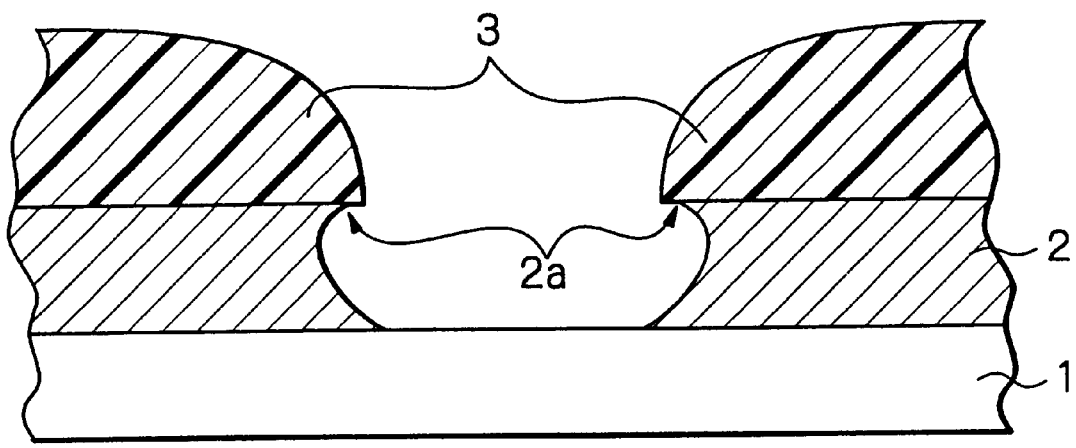

Next, referring to FIG. 3B, in the same way as in FIG. 1B, the Mo layer 2 is etched by a wet process using about 0.5 to 2.5 wt % nitric acid/about 60 to 80 wt % phosphoric acid/about 2.5 to 4.0 % acetic acid solution having a high viscosity of about 40 cP and a temperature of about 38° C. to 42° C. in a spray-type leaf-form type wet processing apparatus as illustrated in FIG. 2, where a spray pressure is about 1.0 kgf/cm² and a spray amount is about 45.0 l/min. In this case, the substrate 1 reciprocates within the wet processing apparatus to obtain a uniform etching rate of the Mo layer 2. The wet process is carried out for a time T of about 140 sec. This time T is determined by $$T = t_E + t_E \cdot (1.3 \sim 1.7)$$

where $t_E$ is a time detected by a transmission type sensor for detecting whether or not the thickness of the Mo layer 2 reaches a predetermined value. Note that the second term $t_E \cdot (1.3 \sim 1.7)$ is an overetching time. Then, the substrate 1 is rinsed by pure water and is dried by an air-knife.

Even in FIG. 3B since the Mo layer 2 has a columnar structure perpendicular to the glass substrate 1, overhanging edges 2a are formed on the ends of the Mo layer 2. Also, since the etching solution has a high viscosity, the etching solution cannot penetrate the interface between the Mo layer 2 and the photoresist pattern 3, so as to enhance the overhanging edges 2a.

Figure 3C:
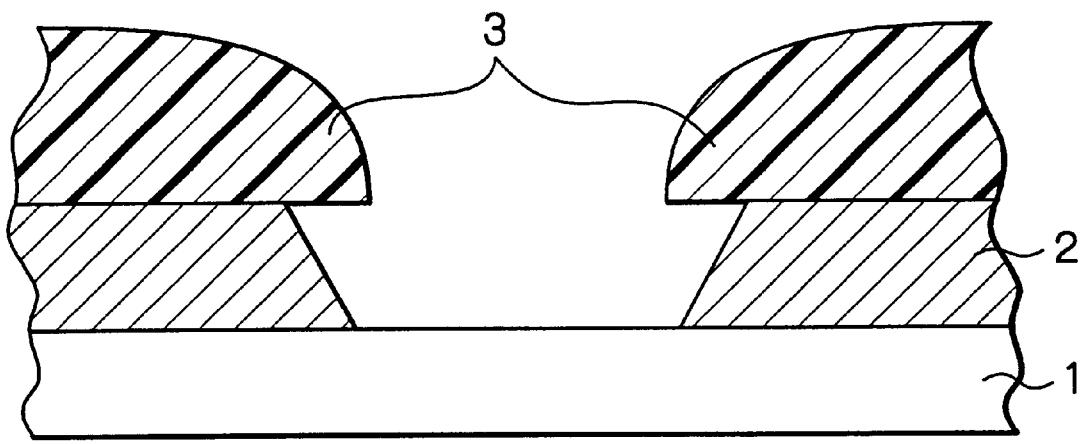
Figure 4:
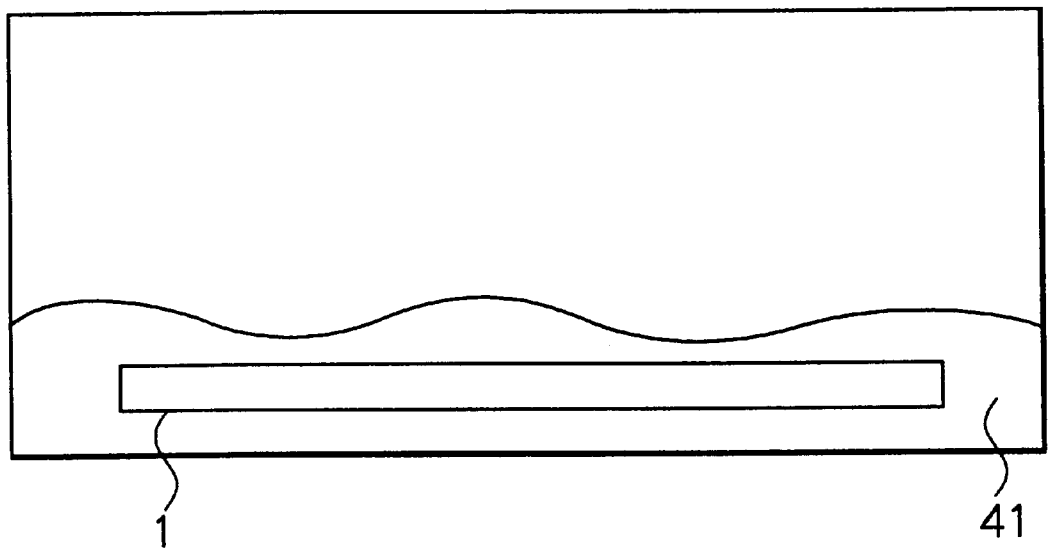
FIG. 4 is a diagram illustrating a dip-type leaf-type wet processing apparatus used for etching the Mo layer of FIG. 3C.

Next, referring to FIG. 3C, the Mo layer 2 is further etched by a wet process using an about 3.0 to 5.0 wt % nitric acid/about 15 to 20 wt % hydrochloric acid solution 41 having a low viscosity of about 1.4 cP and a temperature of about 23° C. to 300° C. under a dip-type leaf-form type wet processing apparatus as illustrated in FIG. 4, where the solution temperature is about 25° C. The wet process is carried out for about 30 to 60 sec. Then, the substrate 1 is rinsed by pure water and is dried by an air-knife.

Figure 3D:
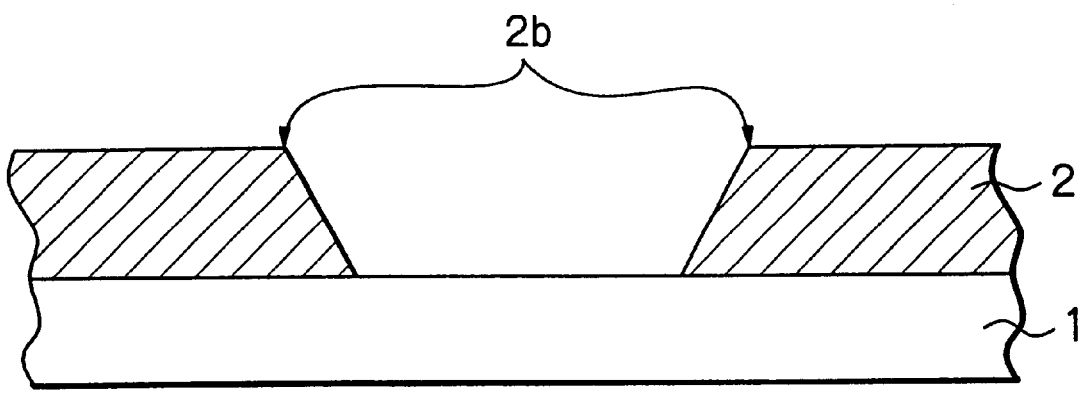

Next, referring to FIG. 3D, the photoresist pattern 3 is removed by releasant at about 70° C.

Note that the Mo layer 2 serves as a lower conductive layer.

As illustrated in FIG. 3D since the etching solution has a low viscosity, the etching solution can penetrate the interface between the Mo layer 2 and the photoresist pattern 3, so that the overhanging edges 2a are etched. As a result, the Mo layer 2 has forward-tapered edges 2b having an angle of about 45° to 60°.

Figure 3E:
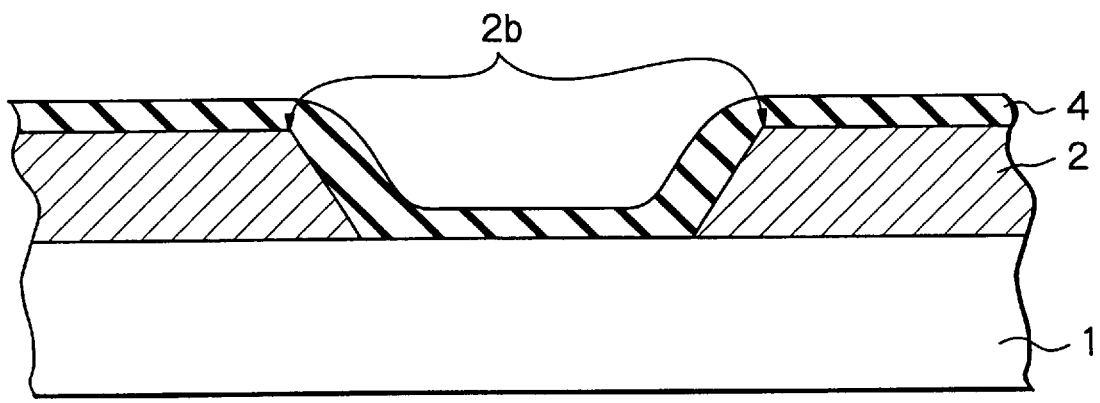

Next, referring to FIG. 3E, in the same way as in FIG. 1D, an insulating layer 4 made of silicon nitride or the like is formed on the Mo layer 2 by a CVD process. In this case, the coverage characteristics of the insulating layer 4 are improved, due to the forward-tapered edges 2b of the Mo layer 2, so that no voids are generated in the insulating layer 4 in the proximity of the forward-tapered edges 2b of the Mo layer 2.

Figure 3F:
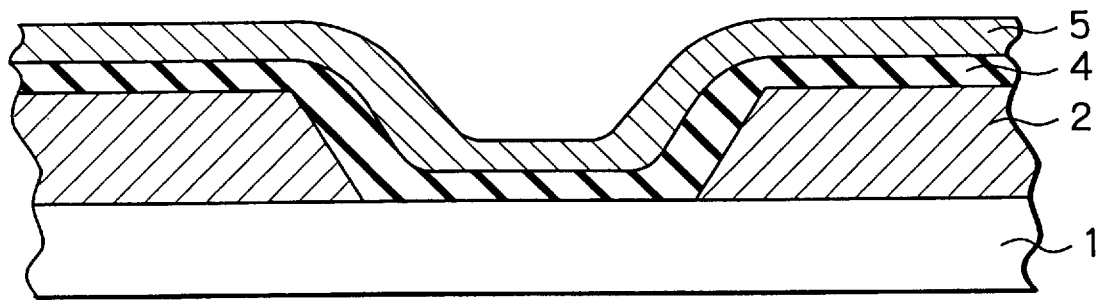

Finally, referring to FIG. 3F, in the same way as in FIG. 1E, an upper conductive layer 5 made of Mo, Cr, ITO or the like is formed on the insulating layer 4.

Thus, in the first-stage etching step of the Mo layer 2, use is made of a high viscosity etching solution to enhance the throughput of the etching operation, although the overhanging edges 2a are formed on the edges of the Mo layer 2. On the other hand, in the second-stage etching step of the Mo layer 2, use is made of a low viscosity etching solution to penetrate the interface between the Mo layer 2 and the photoresist pattern layer 3, so that the overhanging edges 2a are etched. Note that, since the second-stage etching step is carried out without the post-baking operation of the photoresist pattern layer 3, the penetration-effect of the etching solution is enhanced to further etch the overhanging edges 2a. Also, since the throughput of the etching operation upon the Mo layer 2 by the low viscosity etching solution is slow, the etching amount of the Mo layer 2 can be precisely controlled.

In the above-described method according to the present invention the breakdown voltage characteristics of the insulating layer 4 between the conductive layers 2 and 5 do not deteriorate due to the absence of the voids 2a. Also, electrostatic destruction would not start from the forward-tapered edges 2b of the Mo layer 2, which would not destroy elements connected to the Mo layer 2. Further, since the coverage characteristics of the upper conductive layer 5 do not deteriorate, the generation of short-circuited states in the upper conductive layer 5 is suppressed.

Figure 5A:
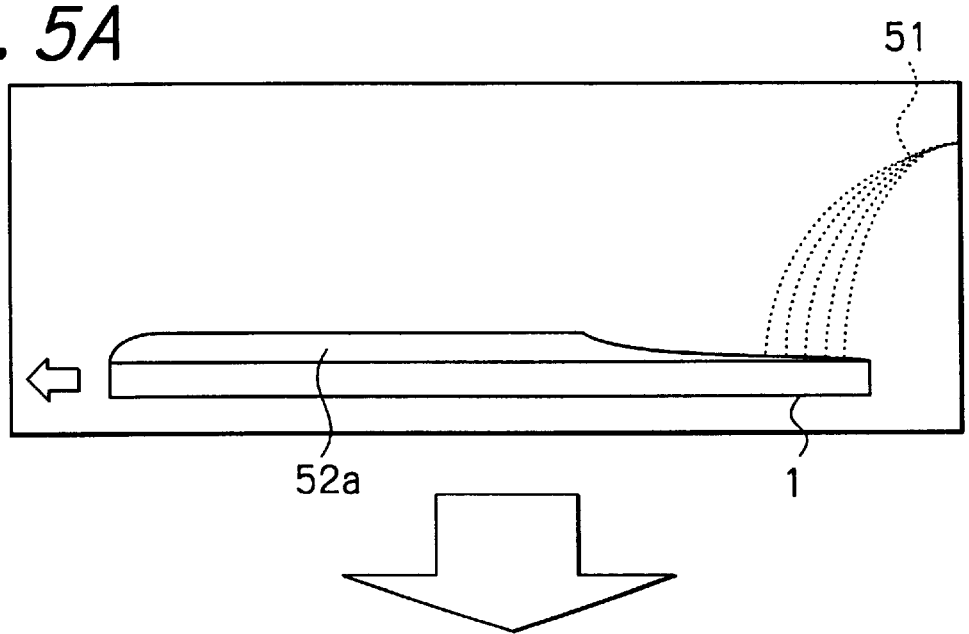
FIG. 5A, 5B and 5C are diagrams illustrating a spray-type leaf-type wet processing apparatus used for etching the Mo layer of FIG. 3C.
Figure 5B:
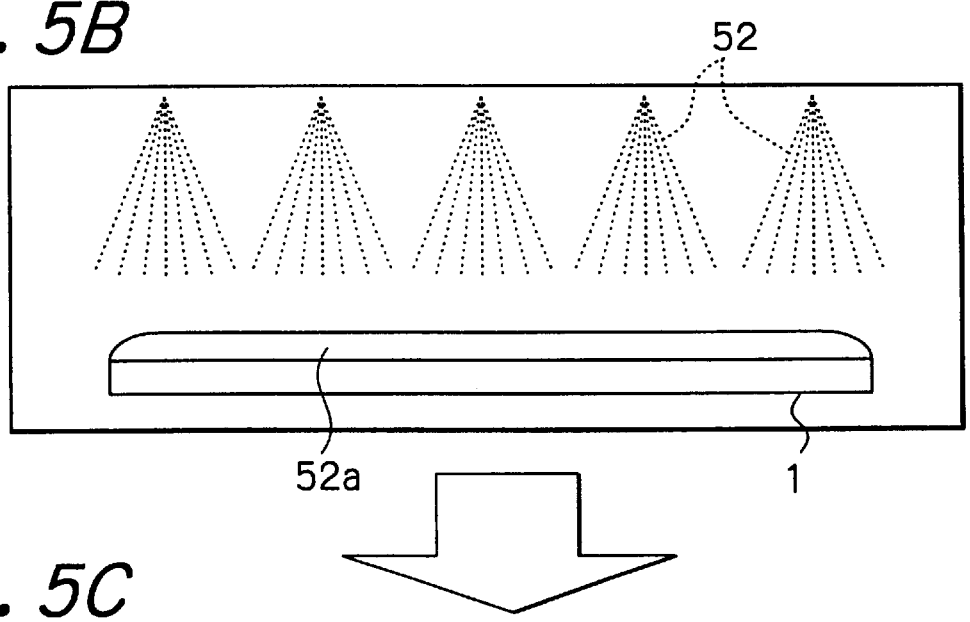
Figure 5C:
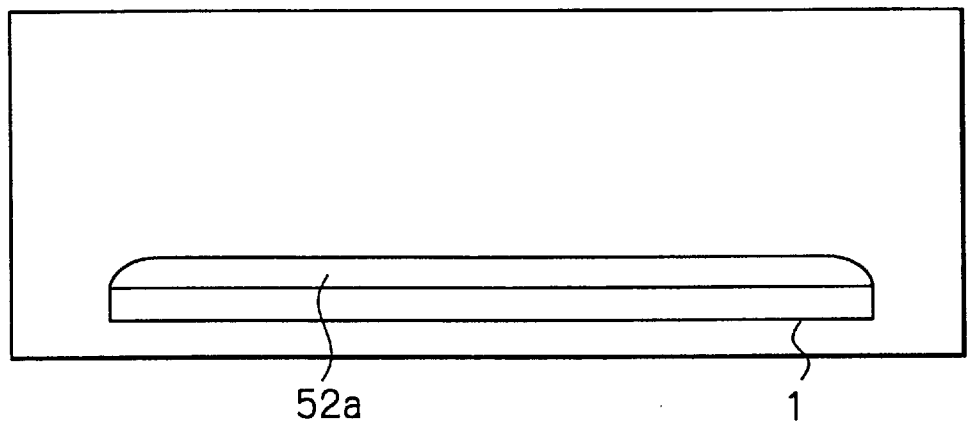

The post-stage etching step of the Mo layer 2 as illustrated in FIG. 3C can be also carried out by a spray-type leaf-form type wet processing apparatus as illustrated in FIGS. 5A, 5B and 5C.

That is, referring to FIG. 5A, the substrate 1 is subjected to a pre-wet process by an inlet shower 51. As a result, the surface of the substrate 1 gets wet by nitric acid/hydrochloric acid solution 51a. This contributes to a uniform etching rate of the entire Mo layer 2 on the substrate 1.

Next, referring to FIG. 5B, nitric acid/hydrochloric acid solution 52a is further applied to the surface of the substrate 1 from nozzles 52 for about 5 to 10 seconds. As a result, the nitric acid/hydrochloric acid solution 52a is located on the surface of the substrate 1 by the surface tension of the solution 52a. This further contributes to the uniform etching rate of the entire Mo layer 2 on the substrate 1.

Finally, referring to FIG. 5C, the substrate 1 remains stationary for about 30 to 60 sec. Note that, if the substrate 1 reciprocates within the wet processing apparatus, the nitric acid/hydrochloric acid solution 52a would slide off the substrate 1.

Thus, the post-stage etching step of the Mo layer carried out by using the spray-type leaf-form type wet processing apparatus as illustrated in FIGS. 5A, 5B and 5C can exhibit the same effect by using the dip-type leaf-form type wet processing apparatus as illustrated in FIG. 4.

As explained hereinabove, according to the present invention, since no voids are generated in an insulating layer between conductive layers, the deterioration of the breakdown voltage characteristic the insulating layer can be suppressed. Also, since electrostatic destruction would not start from the forward-tappered edges of the conductive layer, elements connected to the conductive layer would not be destroyed. Further, since the coverage characteristics of the upper conductive layer do not deteriorate, the generation of short-circuited states in the upper conductive layer can be suppressed.

What is claimed is:

1. A method for manufacturing a conductive pattern layer, comprising the steps of:

depositing a conductive layer on a substrate;

coating an etching mask layer on said conductive layer;

etching said conductive layer by a first etching solution using said etching mask layer to expose said substrate and a sidewall of said conductive layer; and etching said conductive layer by a second etching solution using said etching mask to retard the sidewall of said conductive layer, after said conductive layer etching step by said first etching solution is carried out.

2. The method as set forth in claim 1, wherein a viscosity of said first etching solution is higher than a viscosity of said second etching solution.

3. The method as set forth in claim 1, wherein an etching rate of said conductive layer by said first etching solution is larger than an etching rate of said conductive layer by said second etching solution.

4. The method as set forth in claim 1, wherein said conductive layer is made of molybdenum.

5. The method as set forth in claim 4, wherein said first etching solution is a nitric acid/phosphoric acid/acetic acid solution.

6. The method as set forth in claim 4, wherein said first etching solution is an about 0.5 to 2.5 wt % nitric acid/about 60 to 80 wt % phosphoric acid/about 2.5 to 4.0 wt % acetic acid solution having a temperature of about 38 to 42° C.

7. The method as set forth in claim 4, wherein said second etching solution is a nitric acid/hydrochloric acid solution.

8. The method as set forth in claim 4, wherein said first etching solution is an about 3.0 to 5.0 wt % nitric acid/about 15 to 20 wt % hydrochloric acid solution having a temperature of about 23 to 30° C.

9. The method as set forth in claim 1, wherein said etching mask layer is made of photoresist.

10. The method as set forth in claim 9, wherein said first and second conductive layer etching steps are carried out by using said etching mask layer without performing a post baking operation thereupon.

11. The method as set forth in claim 1, wherein said conductive layer etching step by said first etching solution is carried out in a spray-type wet processing apparatus.

12. The method as set forth in claim 11 wherein said wet processing apparatus is of a leaf-type.

13. The method as set forth in claim 1, wherein said conductive layer etching step by said second etching solution is carried out in a dip-type wet processing apparatus.

14. The method as set forth in claim 13 wherein said wet processing apparatus is of a leaf-type.

15. The method as set forth in claim 1, wherein said conductive layer etching step by said second etching solution is carried out in a spray-type wet processing apparatus.

16. The method as set forth in claim 15, wherein said conductive layer etching step by said second etching solution in said spray-type wet processing apparatus comprises the steps of:

subjecting said substrate to a pre-wet process by said second etching solution;

spraying said second etching solution onto said substrate for about 5 to 10 seconds, after said pre-wet process is carried out; and maintaining said substrate stationary for about 30 to 60 seconds after said spraying step is carried out.

17. The method as set forth in claim 15 wherein said wet processing apparatus is of a leaf-type.

* * * * *